US008067307B2

United States Patent
Choi et al.

(10) Patent No.: US 8,067,307 B2
(45) Date of Patent: Nov. 29, 2011

(54) INTEGRATED CIRCUIT PACKAGE SYSTEM FOR STACKABLE DEVICES

(75) Inventors: DaeSik Choi, Seoul (KR); Sang-Ho Lee, Yeoju (KR); Soo-San Park, Seoul (KR)

(73) Assignee: Stats Chippac Ltd., Singapore (SG)

( * ) Notice: Subject to any disclaimer, the term of this patent is extended or adjusted under 35 U.S.C. 154(b) by 0 days.

(21) Appl. No.: 12/037,291

(22) Filed: Feb. 26, 2008

(65) Prior Publication Data
US 2009/0212408 A1    Aug. 27, 2009

(51) Int. Cl.
*H01L 21/44* (2006.01)
*H01L 23/28* (2006.01)
(52) U.S. Cl. .......................... 438/617; 257/784
(58) Field of Classification Search .................. 257/692, 257/686, 779, 784; 438/611–617
See application file for complete search history.

(56) References Cited

U.S. PATENT DOCUMENTS

| | | | |
|---|---|---|---|
| 6,043,430 A * | 3/2000 | Chun | 174/530 |
| 6,153,922 A | 11/2000 | Sugiyama et al. | |
| 6,268,647 B1 * | 7/2001 | Takahashi et al. | 257/676 |
| 6,285,074 B2 | 9/2001 | Sugiyama et al. | |
| 6,297,545 B1 | 10/2001 | Sugiyama et al. | |
| 7,006,360 B2 | 2/2006 | Kim | |
| 7,195,957 B2 * | 3/2007 | Koon et al. | 438/124 |
| 7,247,934 B2 | 7/2007 | Pu | |
| 2007/0200257 A1 | 8/2007 | Chow et al. | |
| 2007/0210435 A1 * | 9/2007 | Corisis | 257/686 |

* cited by examiner

*Primary Examiner* — Calvin Lee
(74) *Attorney, Agent, or Firm* — Mikio Ishimaru (57) ABSTRACT

An integrated circuit package system comprising: providing a package die; and connecting a connector lead having a first connector end with a protruded connection surface and a lowered structure over the package die.

20 Claims, 4 Drawing Sheets

INTEGRATED CIRCUIT PACKAGE SYSTEM FOR STACKABLE DEVICES

TECHNICAL FIELD

The present invention relates generally to integrated circuit packages and more particularly to integrated circuit package systems with stackable devices.

BACKGROUND ART

The integrated circuit package is the building block used in a high performance electronic system to provide applications for usage in products such as cell phones, surgical equipment, military devices, surveillance devices, space telemetry devices, and a vast line of other high performance products that require small compact. The integrated circuit such as a chip or die contains circuitry that is designed to function in a high performance electronic system. Products having small dimensional requirements rely on limited sized integrated circuit packages with multiple chips or dice to excel in a continually expanding competitive global market.

The integrated circuit package having multiple chips commonly consists of a package base or package substrate, providing a mounting structure on which at least one chip or die is attached and having an enclosure such as an epoxy to protect its contents. The chip or die, a piece of semiconductor material has one side mounted or typically bonded with an electrically insulating and thermally conductive adhesive to the package base or package substrate.

The other side of the chip or die, referred to as an active surface of the chip or die, has electrically conductive areas or bond pads that provide for electrical connections to its circuitry. Leads, consisting of electrically conductive material, attach to the conductive areas or bond pads to provide electrical connection between the circuitry of the chip or die and other circuitry not of the same chip or die.

The other circuitry can be from one of three possible sources. The first possible source can be circuitry resident within the integrated circuit package, such as from another chip, indicative of a multiple chip integrated circuit package. The second possible source can be of circuitry residing outside the integrated circuit package such as from a printed circuit board within the electronic system.

Finally, the third possible source can be circuitry from one or more separate integrated circuit packages having one or more chips or dice within it. The separate integrated circuit packages, connected with the leads, can be enclosed together resulting in a single sealed package structure such as a Package In Package (PIP) or can form individually sealed packages attached by leads, such as a Package On Package (POP).

Clearly, the two most prevalent choices for product designers in need of performance circuitry within a small form factor product require extensive use of PIP or POP. The POP has advantages over the PIP due to reduced manufacturing processing and costs since it does not require an additional step to enclose or cover multiple separate packages into a single package.

The POP also provides the product designer with the capability of exchanging or upgrading one or more individual package during the lifetime of the product, unlike the PIP, which would need to be entirely redesigned.

There exists an industry demand for a POP solution providing lower costs, high manufacturing throughput, small form factor, and design flexibility. Those of ordinary skill in the art are aware of POP benefits, which include component reduction from fewer circuit boards and parts contributing to lower costs and the competitive advantages of responsive time-to-market and continuous flow (build on demand) manufacturing techniques enabled by high manufacturing throughput.

Also, those of ordinary skill in the art are aware of the importance of leverage and flexibility provided with POP through package substitution such as package swapping to improve costs, features, or performance by replacing package components as needed. Attempts have failed to provide a complete solution addressing simplified manufacturing processing, smaller POP dimensions, lower costs due to design flexibility and leveragability, and increased electrical wire connectivity capabilities.

In view of the ever-increasing commercial competitive pressures, along with growing consumer expectations and the diminishing opportunities for meaningful product differentiation in the marketplace, it is critical that answers be found for these problems.

Solutions to these problems have been long sought but prior developments have not taught or suggested any solutions and, thus, solutions to these problems have long eluded those skilled in the art.

DISCLOSURE OF THE INVENTION

The present invention provides a package die; and connecting a connector lead having a first connector end with a protruded connection surface and a lowered structure over the package die.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs.

Where multiple embodiments are disclosed and described, having some features in common, for clarity and ease of illustration, description, and comprehension thereof, similar and like features one to another will ordinarily be described with like reference numerals. The embodiments may be numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the invention, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "on" as used herein means and refers to direct contact among elements. The term "processing" as used herein includes deposition of material, patterning, exposure, development, etching, cleaning, and/or removal of the material or trimming as required in forming a described structure. The term "system" as used herein means and refers to the method and to the apparatus of the present invention in accordance with the context in which the term is used.

Figure 1:
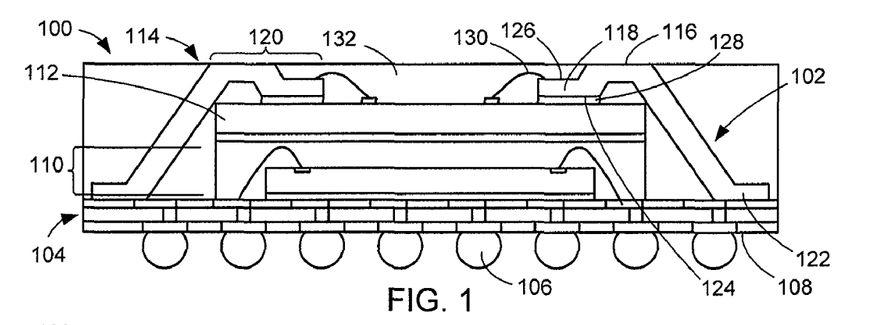
FIG. 1 is a cross-sectional view of an integrated circuit package system taken along line 1-1 of FIG. 2, in a first embodiment of the present invention.
Figure 2:
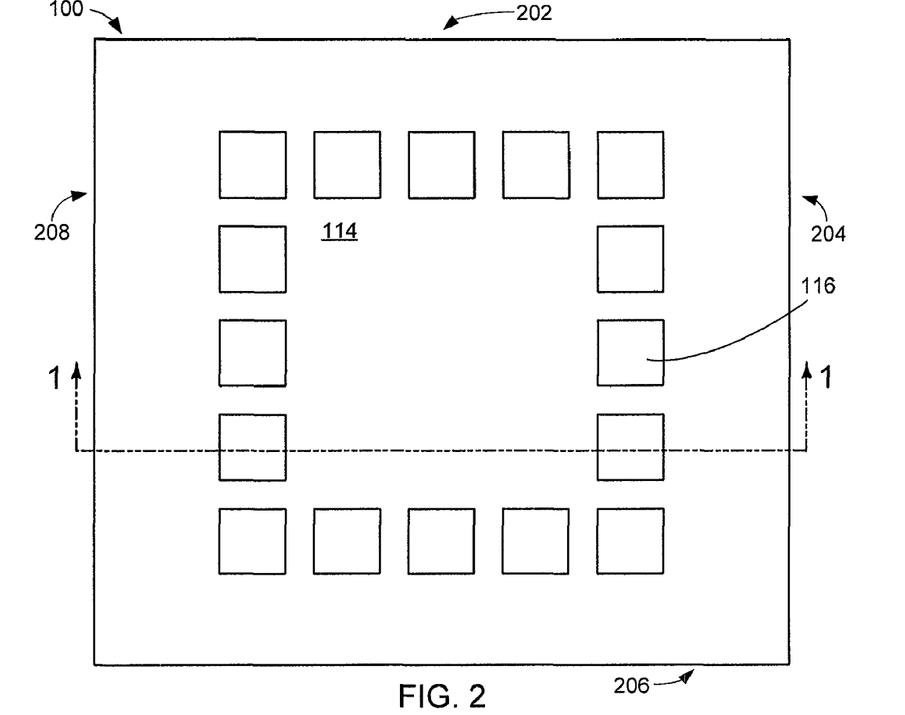
FIG. 2 is a top view of the integrated circuit package system.

Referring now to FIG. 1, therein is shown a cross-sectional view of an integrated circuit package system 100 taken along line 1-1 of FIG. 2, in a first embodiment of the present invention. The integrated circuit package system 100 preferably includes connector leads 102, a package substrate 104, package connectors 106, a connection surface 108, a base package 110, a package die 112, and a top package surface 114.

The package connectors 106 are connected to the connection surface 108 of the package substrate 104. The base package 110 is mounted above the package substrate 104 and the package die 112 is mounted above the base package 110. The top package surface 114 is above the package die 112. The connector leads 102 provide for substantial connectivity surfaces as well as structural rigidity between a first connector end 120 located above the package die 112 and a second connector end 122 located adjacent the base package 110. The connector leads 102 can connect the package die 112 and the package substrate 104 over a lateral side of the package die 112 and the base package 110. The first connector end 120 can be connected to a top side of the package die 112. The second connector end 122 can be connected to a top side of the package substrate 104. The connector leads 102 can include a non-vertical slope between the first connector end 120 and the second connector end 122. The non-vertical slope can contact a periphery edge of an active side of the package die below the first connector end 120.

The connector leads 102 include a protruded connection surface 116 and a lowered structure 118 of the first connector end 120. The lowered structure 118 can be formed at an end of the connector leads 102. The lowered structure 118, located below the top package surface 114, can provide connectivity for the package die 112. The lowered structure 118 can be formed adjacent the protruded connection surface 116. The protruded connection surface 116 having a substantially exposed surface adjacent the top package surface 114 can provide connectivity for an external device or component.

The second connector end 122 of the connector leads 102 can provide connectivity for the base substrate or a next level system. The connector leads 102 can be bent or angled near the second connector end 122. Similarly, the lowered structure 118 can be bent or angled near the first connector end 120. The lowered structure 118 can also include a mount surface 124 and a contact surface 126. A mount material 128 can provide attachment of the mount surface 124 to the package die 112.

The mount material 128 can be composed of material having conductive or non-conductive properties. The contact surface 126 can provide a conductive surface or spacing for die connectors 130 such as bonding wires or any other connection method. A package encapsulant 132 covers the package die 112, the lowered structure 118, the contact surface 126, and the die connectors 130. A side opposite the connection surface 108 and portions of the connector leads 102, with exception of the protruded connection surface 116, can be covered with the package encapsulant 132.

The package substrate 104 includes the package connectors 106 on the connection surface 108 to provide electrical connectivity to a next level system such as another package or printed circuit board. The package substrate 104 can provide electrical connectivity between the package connectors 106 and a surface opposite the connection surface 108 for connectivity to the second connector end 122 or the base package 110.

It has been unexpectedly discovered that any device quantity or any device type such as integrated packages, optical displays, sensors, contact probes connectors, active devices, or passive devices, can be attached to the connector leads 102 having changes in location, distribution, or formation.

Further it has been unexpectedly discovered that product end users can improve product line or field support by performing tasks such as testing, performance monitoring, or apply firmware updates to circuitry within the integrated circuit package system 100. The product end users also found that the protruded connection surface 116 could be used for electrically non-conductive attachment purposes such as directed heat sinks, temperature probe contacts, or structural support attachments such as a standoffs or thermal usages.

Referring now to FIG. 2, therein is shown a top view of the integrated circuit package system 100. The protruded connection surface 116 is shown exposed and substantially coplanar to a plane formed by the top package surface 114, and positioned in a shape of a square. The positioning and shape of the protruded connection surface 116 can be of any geometric shape predetermined by the formation process of the connector leads 102 of FIG. 1. Protruded connection surfaces 116 are shown arranged along a first perimeter side 202, a second perimeter side 204, a third perimeter side 206, and a fourth perimeter side 208 of the integrated circuit package system 100. The protruded connection surfaces 116 as arranged provide the connector leads 102 extended toward each of the first perimeter side 202, the second perimeter side 204, the third perimeter side 206, and the fourth perimeter side 208.

Figure 3:
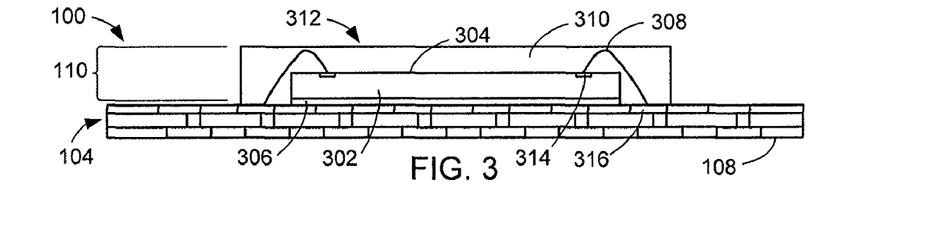
FIG. 3 is a cross-sectional view of the integrated circuit package system in a base package encapsulation phase.

Referring now to FIG. 3, therein is shown a cross-sectional view of the integrated circuit package system 100 in a base package encapsulation phase. The base package 110 includes a base die 302, a first active surface 304, an adhesive layer 306, bonding wires 308, a base encapsulant 310, and a top surface 312.

The base die 302 having the first active surface 304 can include bonding pads 314 providing circuitry connectivity. The bonding wires 308 can connect the bonding pads 314 to package pads 316. The package pads 316 can connect the side opposite the connection surface 108 with the connection surface 108 of the package substrate 104. The package connectors 106 of the integrated circuit package system 100 shown in FIG. 1 provide connectivity between the package substrate 104 and a next level system such as another package or printed circuit board. The surface opposite the first active surface 304 is attached over the package substrate 104 using the adhesive layer 306.

The base package 110 and the bonding wires 308 are covered with the base encapsulant 310 that can include areas of the package substrate 104. The package substrate 104 can include a perimeter consisting of the package pads 316 that surround and do not connect to the base package 110.

Figure 4:
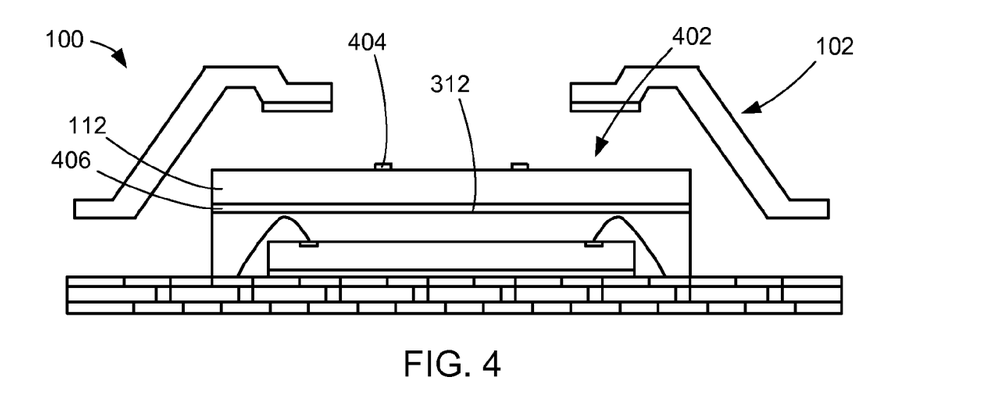
FIG. 4 is the structure of FIG. 3 in a die attachment phase.

Referring now to FIG. 4, therein is shown the structure of FIG. 3 in a die attachment phase. The package die 112, includes a second active surface 402 having package die pads 404. A side opposite the second active surface 402 is attached over the top surface 312 using a second adhesive layer 406. The connector leads 102 are preformed and positioned over the integrated circuit package system 100.

Figure 5:
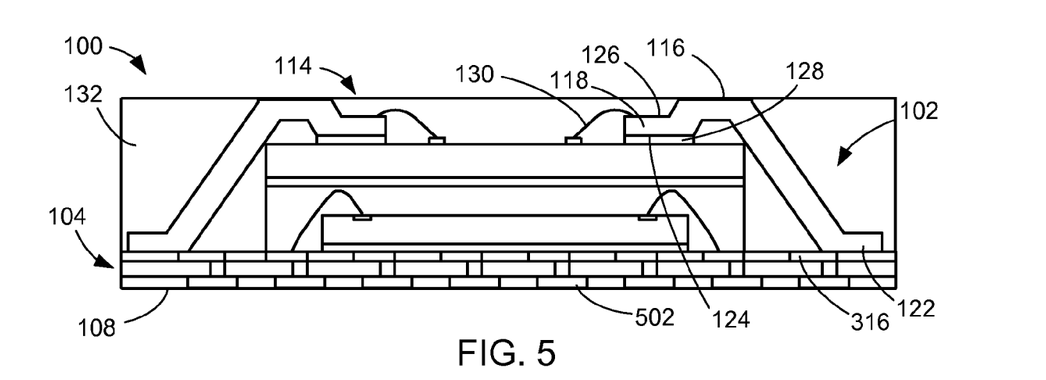
FIG. 5 is the structure of FIG. 4 in an encapsulation phase.

Referring now to FIG. 5, therein is shown the structure of FIG. 4 in an encapsulation phase. The second connector end 122 can be electrically connected to one of the package pads 316 not covered with the base encapsulant 310 of FIG. 3. The mount material 128 attaches the second active surface 402 of FIG. 4 to the mount surface 124 of the connector leads 102. The mount material 128 can consists of an electrically conductive attachment material or of a non-conductive attachment material.

The mount material 128 can be used to adjust the attachment physically, such as coplanar, planar, or any other user specified orientation requirements, of the connector leads 102. The contact surface 126 of the lowered structure 118 can connect to the package die pads 404 of FIG. 4 using the die connectors 130 such as aluminum wire, copper wire, or any other material having conductive properties.

After connections have been completed, the integrated circuit package system 100 is covered with the package encapsulant 132 from the protruded connection surface 116 down to the package substrate 104 and having the protruded connection surface 116 substantially exposed on the top package surface 114.

The package connectors 106 of FIG. 1 are attached to solder pads 502 on the connection surface 108 that can connect to any electrical connections made on the surface opposite the connection surface 108 such as the package pads 316, resulting in the integrated circuit package system 100 of FIG. 1.

Figure 6:
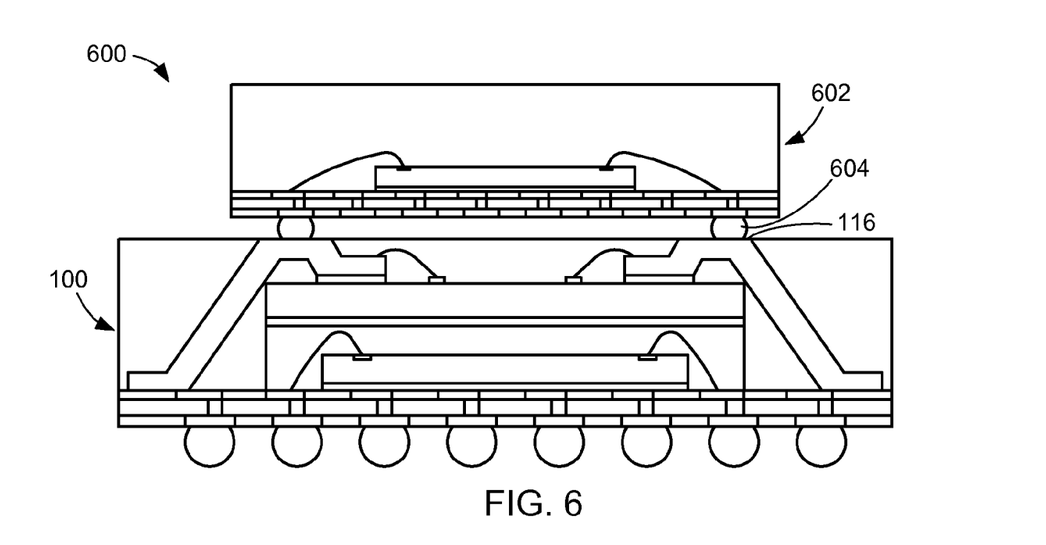
FIG. 6 is a cross-sectional view of an integrated circuit package system in a second embodiment of the present invention.

Referring now to FIG. 6, therein is shown a cross-sectional view of an integrated circuit package system 600 in a second embodiment of the present invention. Illustrated is a top component 602, such as a ball grid array integrated circuit package or any other component, attached on the integrated circuit package system 100 of FIG. 1.

The top component 602 is connected to the protruded connection surface 116 of the integrated circuit package system 100 with solder balls 604. The resulting assembly can be mounted onto a next level system such as another package or printed circuit board. It is noted that the connection to the protruded connection surface 116 is not restricted or limited and any method or material providing contact connectivity can be used.

The top component 602 need not be an integrated circuit package and can be of other device types such as a sensor, a display, a mechanical switch, discrete wire connections, antennas, a touch pad, or any component combination that can attach to one or more of the protruded connection surface 116 located on the integrated circuit package system 100.

The top component 602 also can consist of non-active device types with no electrical connectivity requirements such as mechanical standoffs, heat sink, or similar type structure. Finally, the top component 602 can be omitted leaving the protruded connection surface 116 exposed for indirect uses such as testing, performance metrics, diagnostic, firmware updates, or other types of applications requiring external access to circuitry of the integrated circuit package system 600 or the next level system.

Figure 7:
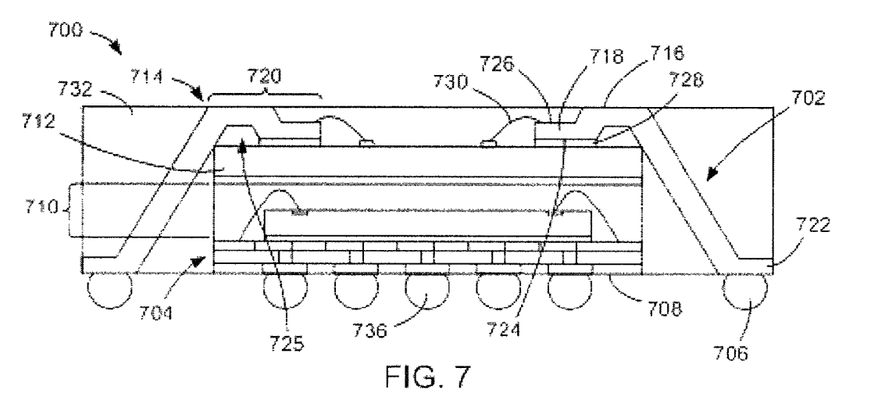
FIG. 7 is a cross-sectional view of an integrated circuit package system in a third embodiment of the present invention.

Referring now to FIG. 7, therein is shown a cross-sectional view of an integrated circuit package system 700 in a third embodiment of the present invention. The integrated circuit package system 700 preferably includes connector leads 702, a package substrate 704, package lead connectors 706, a connection surface 708, a base package 710, a package die 712, a top package surface 714, and package connectors 736.

The package connectors 736 are connected to the connection surface 708 of the package substrate 704. The base package 710 is mounted above the package substrate 704 and the package die 712 is mounted above the base package 710. The top package surface 714 is above the package die 712.

The connector leads 702 provide for connectivity surfaces as well as structural rigidity between a first connector end 720 located above the package die and a second connector end 722 located adjacent the package substrate 704. The connector leads 702 can include a protruded connection surface 716 and a lowered structure 718 of the first connector end 720.

The lowered structure 718 can be formed at an end of the connector leads 702. The lowered structure 718, located below the top package surface 714, can provide connectivity for the package die 712. The protruded connection surface 716 can be formed adjacent the lowered structure 718. The protruded connection surface 716, having a substantially exposed contact surface adjacent to the top package surface 714, can provide connectivity for an external device such as an integrated circuit package or any other component.

The second connector end 722 of the connector leads 702 is connected to the package lead connectors 706 and can provide connectivity for a next level system. The connector leads 702 can be bent and angled near the second connector end 722. The lowered structure 718 can include a mount surface 724 and a contact surface 726. A mount material 728 can provide attachment of the mount surface 724 to the package die 712. The first connector end 720 is further shown having a recess 725 horizontally aligned with the protruded connection surface 716 and is nearer vertically to the protruded connection surface 716 than the mount surface 724 of the lowered structure 718.

The mount material 728 can be composed of material having conductive or non-conductive properties. The contact surface 726 can provide a conductive surface or spacing for die connectors 730 such as bonding wires or any other connection method. A package encapsulant 732 covers the package die 712, the lowered structure 718, the contact surface 726, and the die connectors 730.

A side opposite the connection surface 708 and portions of the connector leads 702, with exception of the protruded connection surface 716, can be covered with the package encapsulant 732. The package substrate 704 includes the package connectors 736 on the connection surface 708 to provide connectivity to a next level system such as another package or printed circuit board.

The package substrate 704 can provide electrical connectivity between the package connectors 736 and the base package 710. The package lead connectors 706 can provide electrical connectivity between the connector leads 702 and a next level system such as another package or printed circuit board.

It has been unexpectedly discovered that having the package connectors 736 electrically and physically separated from the package lead connectors 706 can provide substantially improved signal characteristics such as higher signal to noise ratios (SNR), reduced total harmonic distortion (THD), and similar signal quality characteristics.

Figure 8:
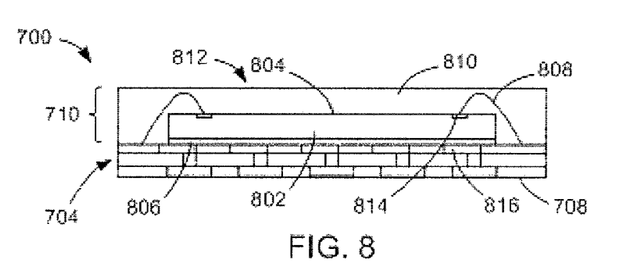
FIG. 8 is a cross-sectional view of the integrated circuit package system in a base package encapsulation.

Referring now to FIG. 8, therein is shown a cross-sectional view of the integrated circuit package system 700 in a base package encapsulation. The base package 710 includes a base die 802, a first active surface 804, an adhesive layer 806, bonding wires 808, a base encapsulant 810, and a top surface 812.

The base die 802 having the first active surface 804 can include bonding pads 814 providing circuitry connectivity. The bonding wires 808 can connect the bonding pads 814 to package pads 816. The package pads 816 can connect the side opposite the connection surface 708 with the connection surface 708 of the package substrate 704. The package connectors 736 of the integrated circuit package system 700 shown in FIG. 7 can provide connectivity between the base package 710 and a next level system such as another package or printed circuit board.

The surface opposite the first active surface 804 is attached over the package substrate 704 using the adhesive layer 806. The connection surface 708 can be masked to prevent contact with the base encapsulant 810. The base package 710 is covered with the base encapsulant 810.

Figure 9:
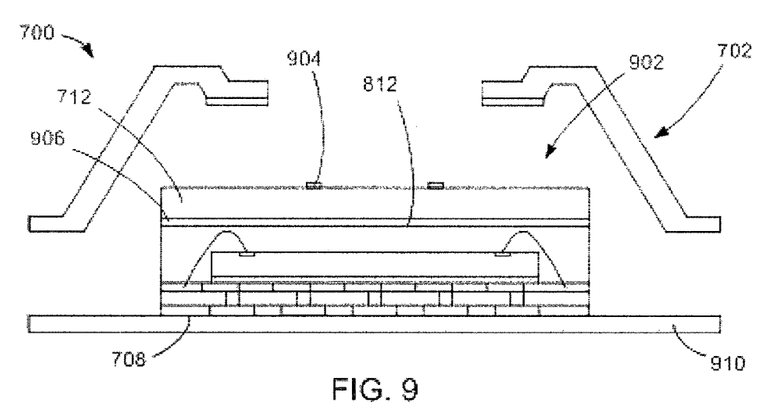
FIG. 9 is a view of the structure of FIG. 8 in a die attachment phase.

Referring now to FIG. 9, therein is shown the structure of FIG. 8 in a die attachment phase. The package die 712, includes a second active surface 902 having package die pads 904. A side opposite the second active surface 902 is attached over the top surface 812 using a second adhesive layer 906. The connector leads 702 are preformed and positioned over the integrated circuit package system 700 and the connection surface 708 is attached to a tape carrier film 910.

Figure 10:
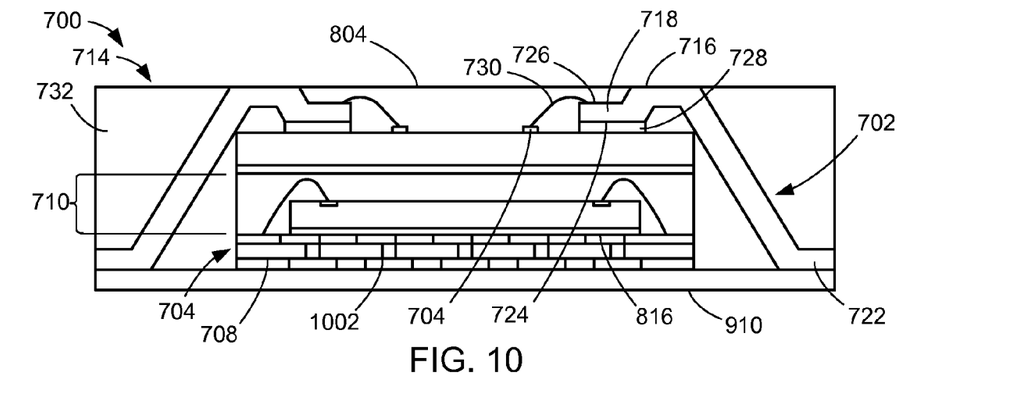
FIG. 10 is a view of the structure of FIG. 9 in an encapsulation phase.

Referring now to FIG. 10, therein is shown the structure of FIG. 9 in an encapsulation phase. The second connector end 722 is positioned onto the tape carrier film 910. The mount material 728 attaches the second active surface 902 of FIG. 9 to the mount surface 724 of the connector leads 702. The contact surface 726 of the lowered structure 718 can be connected to the package die pads 904 of FIG. 9 using the die connectors 730.

The integrated circuit package system 700 is covered with the package encapsulant 732 from the protruded connection surface 716 down to the package substrate 704. The second connector end 722 and the protruded connection surface 716 adjacent to the top package surface 714 can be substantially exposed. The integrated circuit package system 700 is separated from the tape carrier film 910.

The package connectors 736 of FIG. 7 are attached to solder pads 1002 on the connection surface 708 and the package lead connectors 706 of FIG. 7 are attached to the second connector end 722 of the connector leads 702. The solder pads 1002 can connect to the side opposite the connection surface 708 resulting in connectivity to the base package 710 and the package pads 816.

Figure 11:
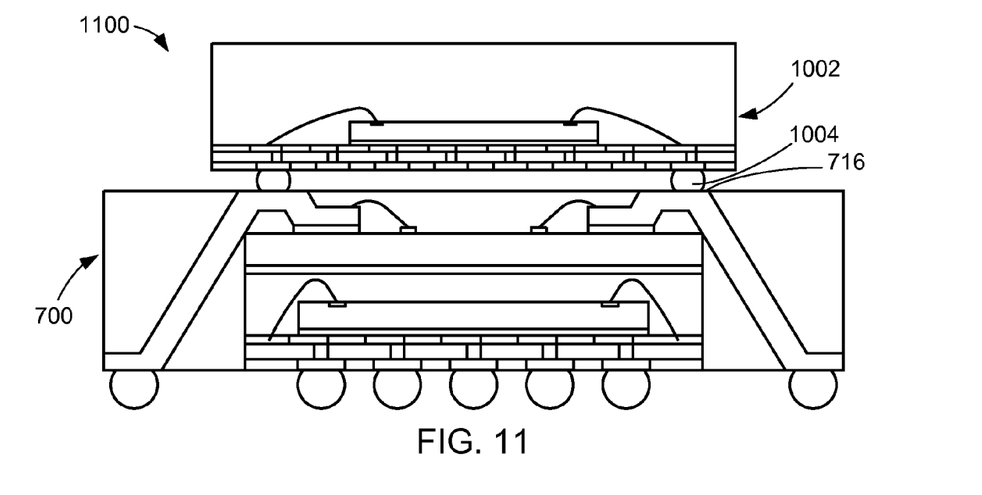
FIG. 11 is a cross-sectional view of an integrated circuit package system in a fourth embodiment of the present invention.

Referring now to FIG. 11, therein is shown a cross-sectional view of an integrated circuit package system 1100 in a fourth embodiment of the present invention. Illustrated is a top component 1102, such as a ball grid array integrated circuit package or any other component, attached on the integrated circuit package system 700 of FIG. 7. The top component 1102 is connected to the protruded connection surface 716 of the integrated circuit package system 700 with solder balls 1104.

Figure 12:
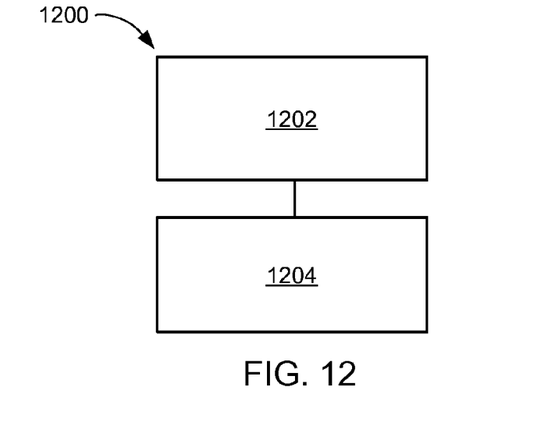
FIG. 12 therein is shown a flow chart of an integrated circuit package system for manufacturing the integrated circuit package system in an embodiment of the present invention.

Referring now to FIG. 12, therein is shown a flow chart of an integrated circuit package system 1200 for manufacturing the integrated circuit package system 100 in an embodiment of the present invention. The system 1200 includes providing a package in a block 1202; and connecting a connector lead having a first connector end with a protruded connection surface and a lowered structure over the package die in a block 1204.

In greater detail, a system to provide the method and apparatus of the integrated circuit package system 100, in an embodiment of the present invention, is performed as follows:
1. Providing a package die having a package die pad.
2. Connecting a connector lead having a first connector end with a protruded connection surface and a lowered structure near the package die pad.
3. Applying a package encapsulant over the package die and the connector lead providing the protruded connection surface substantially exposed.

Thus, it has been discovered that the integrated circuit package system method and apparatus of the present invention furnish important and heretofore unknown and unavailable solutions, capabilities, and functional aspects. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. A method of manufacture of an integrated circuit package system comprising:
   providing a package substrate;
   mounting a base package above the package substrate;
   mounting a package die above the base package; and
   connecting a connector lead, having a first connector end with a protruded connection surface, over the package die and a second connector end attached to the package substrate, and having a non-vertical slope of the connector lead contacting a periphery edge of an active side of the package die below the first connector end.

2. The method as claimed in claim 1 wherein providing the package die includes attaching the package die over a base die.

3. The method as claimed in claim 1 further comprising connecting a top component over the protruded connection surface of the connector lead.

4. The method as claimed in claim 1 further comprising:
providing the package substrate having the package die thereover; and
connecting the connector lead to the package substrate.

5. The method as claimed in claim 1 further comprising connecting a package lead connector to the connector lead.

6. A method of manufacture of an integrated circuit package system comprising:
providing a package substrate;
mounting a base package above the package substrate;
mounting a package die having a package die pad above the base package;
connecting a connector lead, having a first connector end with a protruded connection surface, near the package die pad and a second connector end attached to the package substrate, and having a non-vertical slope of the connector lead contacting a periphery edge of an active side of the package die below the first connector end; and
applying a package encapsulant over the package die and the connector lead providing the protruded connection surface substantially exposed.

7. The method as claimed in claim 6 wherein providing the package die includes attaching the package die over a base package.

8. The method as claimed in claim 6 further comprising connecting a mount material to the package die and the connector lead.

9. The method as claimed in claim 6 further comprising:
providing the package substrate having a connection surface; and
connecting a second connector end of the connector lead to a side opposite the connection surface.

10. The method as claimed in claim 6 further comprising connecting a package lead connector to the second connector end of the connector lead.

11. An integrated circuit package system comprising:
a package substrate;
a base package above the package substrate;
a package die above the base package; and
a connector lead, having a first connector end with a protruded connection surface, over the package die and a second connector end attached to the package substrate, and having a non-vertical slope of the connector lead contacting a periphery edge of an active side of the package die below the first connector end.

12. The system as claimed in claim 11 wherein the package die is over a base die.

13. The system as claimed in claim 11 further comprising a top component over the protruded connection surface of the connector lead.

14. The system as claimed in claim 11 further comprising a package substrate having the package die thereover wherein the connector lead is connected to the package substrate.

15. The system as claimed in claim 11 further comprising a package lead connector connected to the connector lead.

16. The system as claimed in claim 11 wherein:
the package die has a package die pad;
the connector lead has the first connector end with the protruded connection surface and the lowered structure near the package die pad; and
further comprising:
a package encapsulant over the package die and the connector lead providing the protruded connection surface substantially exposed.

17. The system as claimed in claim 16 wherein the package die is over a base package.

18. The system as claimed in claim 16 further comprising a mount material connected to the package die and the connector lead.

19. The system as claimed in claim 16 further comprising:
a package substrate having a connection surface; and
a second connector end of the connector lead connected to a side opposite the connection surface.

20. The system as claimed in claim 16 further comprising a package lead connector connected to the second connector end of the connector lead.

* * * * *

UNITED STATES PATENT AND TRADEMARK OFFICE
CERTIFICATE OF CORRECTION

PATENT NO.        : 8,067,307 B2                                         Page 1 of 1
APPLICATION NO.   : 12/037291
DATED             : November 29, 2011
INVENTOR(S)       : Choi et al.

It is certified that error appears in the above-identified patent and that said Letters Patent is hereby corrected as shown below:

Column 2:
line 41, add double dashes between numbers 1-1 as follows: delete "along line 1-1 of" and insert therefor --along line 1--1 of--

Column 3:
line 47, add double dashes between numbers 1-1 as follows: delete "line 1-1 of FIG. 2," and insert therefor --line 1--1 of FIG. 2,--

Column 6:
lines 58-59, delete "further shown haying a recess" and insert therefor --further shown having a recess--

Signed and Sealed this
Twelfth Day of June, 2012

David J. Kappos
*Director of the United States Patent and Trademark Office*